United States Patent
Bai et al.

(10) Patent No.: US 8,426,265 B2
(45) Date of Patent: Apr. 23, 2013

(54) METHOD FOR GROWING STRAIN-INDUCING MATERIALS IN CMOS CIRCUITS IN A GATE FIRST FLOW

(75) Inventors: Bo Bai, White Plains, NY (US); Linda Black, Wappinger Falls, NY (US); Abhishek Dube, Fishkill, NY (US); Judson R. Holt, Wappingers Falls, NY (US); Viorel C. Ontalus, Danbury, CT (US); Kathryn T. Schonenberg, Wappingers Falls, NY (US); Matthew W. Stoker, Hopewell Junction, NY (US); Keith H. Tabakman, Fishkill, NY (US)

(73) Assignees: International Business Machines Corporation, Armonk, NY (US); GlobalFoundries, Inc., Grand Cayman (KY)

( * ) Notice: Subject to any disclaimer, the term of this patent is extended or adjusted under 35 U.S.C. 154(b) by 133 days.

(21) Appl. No.: 12/938,457

(22) Filed: Nov. 3, 2010

(65) Prior Publication Data

US 2012/0104507 A1  May 3, 2012

(51) Int. Cl.
*H01L 21/8238* (2006.01)
(52) U.S. Cl.
USPC ............ 438/224; 257/E21.09; 257/E29.193; 438/154; 438/222; 438/228; 438/481
(58) Field of Classification Search ........... 257/E29.193, 257/E21.09; 438/222, 224, 228, 154, 481
See application file for complete search history.

(56) References Cited

U.S. PATENT DOCUMENTS

| | | | | |
|---|---|---|---|---|
| 6,165,826 A | * | 12/2000 | Chau et al. | 438/231 |
| 7,670,934 B1 | * | 3/2010 | Pal et al. | 438/481 |
| 7,691,698 B2 | * | 4/2010 | Chidambarrao et al. | 438/199 |
| 7,808,051 B2 | * | 10/2010 | Hou et al. | 257/368 |
| 8,168,489 B2 | * | 5/2012 | Chen et al. | 438/199 |
| 2004/0129979 A1 | | 7/2004 | Park et al. | |
| 2005/0082616 A1 | | 4/2005 | Chen et al. | |
| 2008/0121985 A1 | | 5/2008 | Chen et al. | |
| 2008/0199998 A1 | | 8/2008 | Chen et al. | |

OTHER PUBLICATIONS

Peters, "Scalling to 22 nm Process", Semiconductor International, Jan. 1, 2009, pp. 1-3.
Monahan, "Enabling Double Patterning at the 32nm Node", Yield Management Solutions, Spring 2007, pp. 44-47.
Chris A. Mack, "Seeing Double," IEEE Spectrum, Nov. 2008, pp. 1-6.

* cited by examiner

*Primary Examiner* — John C Ingham
(74) *Attorney, Agent, or Firm* — Gibb & Riley, LLC; Yuanmin Cai, Esq.

(57) ABSTRACT

A method of manufacturing a complementary metal oxide semiconductor (CMOS) circuit, in which the method includes a reactive ion etch (RIE) of a CMOS circuit substrate that forms recesses, the CMOS circuit substrate including: an n-type field effect transistor (n-FET) region; a p-type field effect transistor (p-FET) region; an isolation region disposed between the n-FET and p-FET regions; and a gate wire comprising an n-FET gate, a p-FET gate, and gate material extending transversely from the n-FET gate across the isolation region to the p-FET gate, in which the recesses are formed adjacent to sidewalls of a reduced thickness; growing silicon germanium (SiGe) in the recesses; depositing a thin insulator layer on the CMOS circuit substrate; masking at least the p-FET region; removing the thin insulator layer from an unmasked n-FET region and an unmasked portion of the isolation region; etching the CMOS circuit substrate with hydrogen chloride (HCl) to remove the SiGe from the recesses in the n-FET region; and growing silicon carbon (SiC) in the exposed recesses.

16 Claims, 7 Drawing Sheets

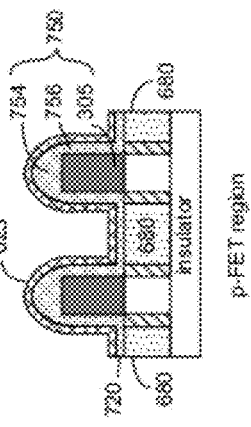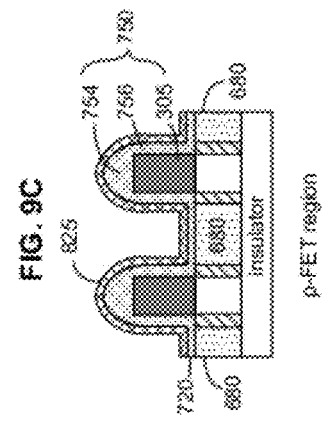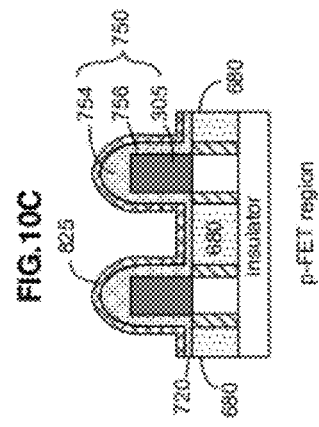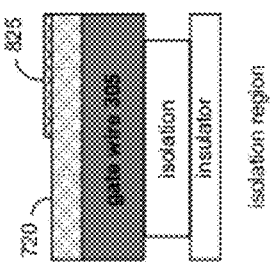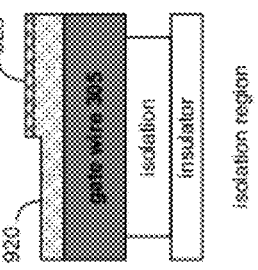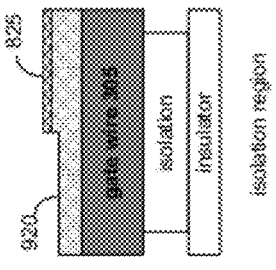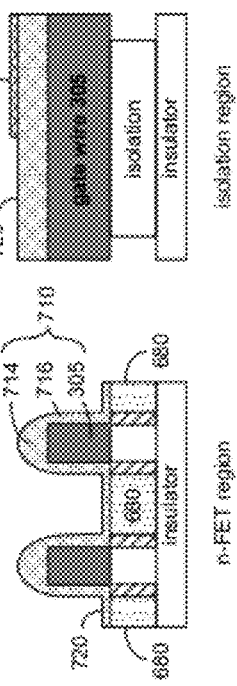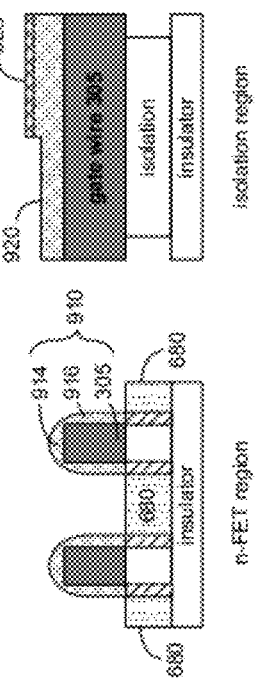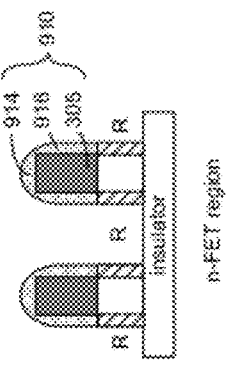

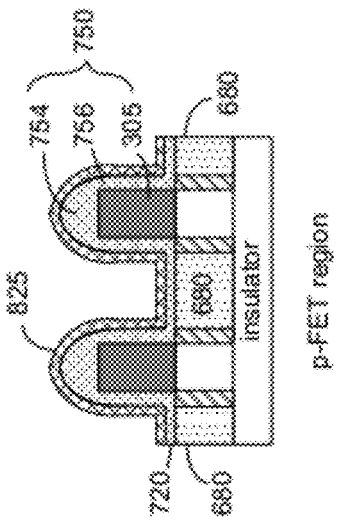
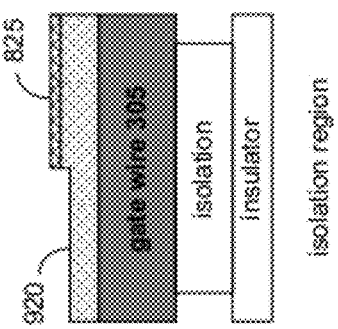
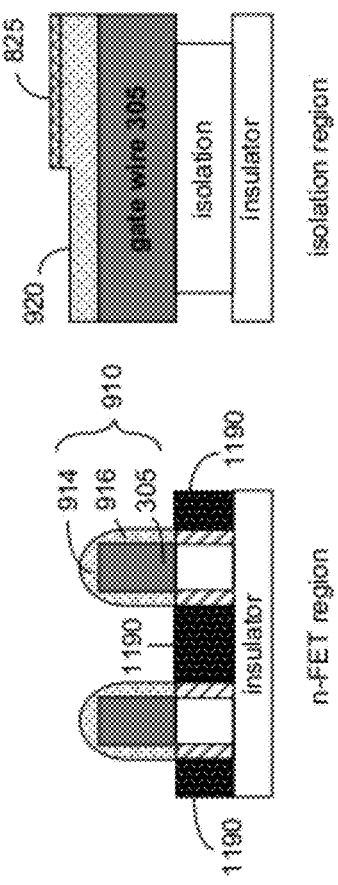
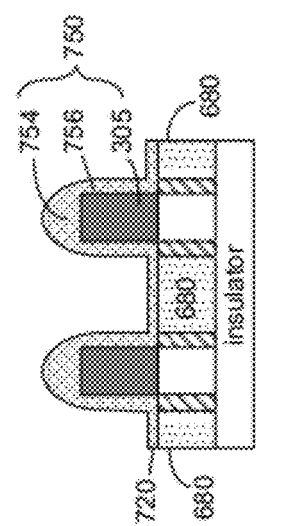
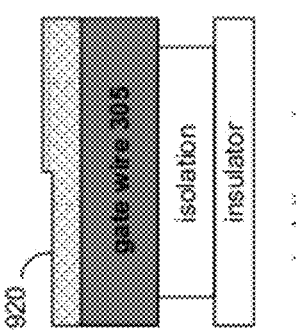
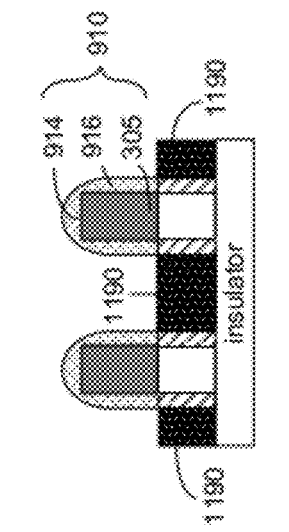

METHOD FOR GROWING STRAIN-INDUCING MATERIALS IN CMOS CIRCUITS IN A GATE FIRST FLOW

BACKGROUND

1. Field of the Invention

The present invention relates to a method of growing embedded compressive and a tensile strain-inducing materials in source/drain (S/D) regions of a p-type field effect transistor, p-FET, and an n-type field effect transistor, n-FET, respectively, of a complementary metal oxide semiconductor (CMOS) circuit in a gate first flow for manufacture. In particular, the method uses a reactive ion etch (RIE) to form recesses within the S/D regions of the transistors of the CMOS circuit for successive epitaxial growths of the two embedded strain-inducing materials. More particularly, the CMOS circuit includes a gate wire between extending from a gate of an n-FET, over an isolation region, to a gate of a p-FET.

2. Description of the Related Art

Numerous performance and economic advantages have been achieved by the scaling of semiconductor devices to smaller dimensions. For example, the scaling of metal oxide semiconductor field effect transistors (MOSFETs) has lead to shorter channel lengths, increased switching speeds, and greater circuit densities.

Scaling transistors to smaller dimensions is limited by characteristics of the transistor's performance. For example, shorter channel lengths of smaller dimensioned transistors can produce undesired variability of threshold voltages and increased drain leakage currents. One means of improving transistor performance for transistors showing such short channel effects is to introduce an appropriate mechanical stress into source/drain (S/D) regions that surround a channel of a transistor. It is known that a compressive stress induced in the channel of a p-FET by, for example, a proximate silicon germanium (SiGe) layer, will enhance majority charge carrier mobility within the p-FET's channel, and thus, enhance the p-FET's performance, and that a tensile stress, induced in the channel of an n-FET by, for example, a proximate silicon carbon (SiC) layer, will enhance majority charge carrier mobility within the n-FET's channel, and thus, enhance the n-FET's performance. It is also known that an embedded layer of a strain-inducing material, i.e., a layer formed coplanar to or below the surface of the substrate, can produce larger stresses on the channel of a transistor, when compared to a layer of the same strain inducing material formed above the surface of the substrate.

Typically, when strain-inducing materials are introduced into the S/D regions proximate to the channels of n-FET and p-FET transistors in a gate first flow for the manufacture of a CMOS circuit, two separate processes are used. A first process may include: depositing a first protective layer over both n-FET and p-FET regions of the CMOS circuit, each transistor region including a gate stack formed on a substrate and S/D regions formed within the substrate; forming a first hard mask over the n-FET region; a first reactive ion etch to remove the first protective layer over the p-FET region and to form recesses within the S/D regions adjacent to the p-FET gate stack; and epitaxially growing SiGe within the recesses adjacent to the p-FET gate stack. Subsequently, the first hard mask covering the n-FET region is removed and a second process follows. The second process may include: depositing a second protective layer over both the n-FET and p-FET regions of the CMOS circuit, each transistor region including a gate stack formed on a substrate and S/D regions formed within the substrate; a second reactive ion etch to remove the second protective layer over the n-FET region and to form recesses within the S/D regions adjacent to the n-FET gate stack; and epitaxially growing SiC within the recesses adjacent to the n-FET gate stack. Subsequently, the second S/D mask covering the n-FET region is removed. Thus, the two separate processes include depositing a first protective layer over both the n-FET and p-FET regions, a first reactive ion etch to remove a portion of the first protective layer that covers the n-FET region, depositing a second protective layer over both the n-FET and p-FET regions, and a second reactive ion etch to remove a portion of the second protective layer that covers the p-FET region.

A gate wire is a basic component of CMOS circuits and is formed by a "wire" of gate material, for example, polysilicon, that includes a gate of an n-FET transistor at one end of the wire, a gate of a p-FET transistor at the other end of the wire, and gate material extending between the n-FET gate and the p-FET gate. In an area located between the n-FET and p-FET regions, the gate wire overlies a substrate of insulating material, which electrically isolates the n-FET region from the p-FET region. A gate wire is used, for example, at the input of a CMOS inverter circuit.

Manufacturing a CMOS circuit that includes a gate wire is problematic, when the two separate processes for introducing strain-inducing materials into S/D regions of n-FET and p-FET transistors in a gate first flow are used. The two processes include formation of a first hard mask over the first protective layer in the n-FET region and of a second hard mask over the second protective layer in the p-FET region. Subsequently, each of the protective layers is removed by first and second reactive ion etches over transistor regions not covered by a hard mask. However, with small dimensions, for example, CMOS transistors of 22 nanometer node technology or smaller, the probability of a misalignment of a few nanometers in the placement of the first hard mask and the second hard mask at a junction between the n-FET and the p-FET regions is significant. It has been shown that misalignment of the two hard masks can result in CMOS circuit defects, caused by either non-overlap or overlap of the protective layers deposited on a gate wire disposed between the n-FET and the p-FET regions.

Referring to FIG. 1A, a top view shows a misalignment of two non-overlapping hard masks 102, 104 relative to a portion of a gate wire 105 disposed between n-FET and p-FET S/D regions 106, 108, respectively, in a CMOS circuit formed by a gate first flow, while FIG. 1B shows a transverse section of a portion of the CMOS circuit through a transverse section line A-A of the gate wire 105 in FIG. 1A. In FIG. 1A, the first hard mask 102 of the first process covers a portion of a first protective layer (not shown) including the n-FET S/D region 106. A first reactive ion etch removes the remaining portion of the first protective layer not covered by the first hard mask 102, including a non-overlap region disposed between the n-FET and p-FET S/D regions 106, 108. Etching the first protective layer in the non-overlap region, however, exposes the underlying gate wire 105. The first hard mask 102 is then removed. The second hard mask 104 of the second process covers a portion of the second protective layer (not shown) including the p-FET S/D region 108. A second reactive ion etch removes the remaining portion of the second protective layer not covered by the second hard mask 104, including the non-overlap region. However, etching the second protective layer in the non-overlap region also exposes the underlying gate wire 105.

Referring to FIG. 1B, a first protective layer 112 is disposed over the gate of the n-FET S/D region 106, i.e., the left-end of gate wire 105, that had been masked by the first hard mask 102, while the second protective layer 114 is disposed over the gate of the p-FET S/D region 108, i.e., the right-end of gate wire 105, that had been masked by the second hard mask 104. The gate wire 105, however, is exposed in the non-overlap region created by the two non-overlapping hard masks 102, 104. In the exposed non-overlap region, epitaxial growth of a strain-inducing material, meant to fill the recesses etched in the S/D regions of the transistors adjacent to their gate stacks, can occur on the exposed polysilicon gate material and cause defects in a subsequent silicidation process in the manufacture of the CMOS circuit.

Referring to FIG. 2A, a top view shows a misalignment of two overlapping hard masks 202, 204 on a portion of a gate wire 205 formed disposed between n-FET and p-FET S/D regions 206, 208, respectively, in a CMOS circuit, while FIG. 2B shows a transverse section of the portion of the CMOS circuit through the transverse section line A-A of the gate wire 205 in FIG. 2A. In FIG. 2A, the first hard mask 202 of the first process covers a portion of the first protective layer (not shown) including the n-FET S/D region 206 and an overlap region, which comprises a portion of the first protective layer to be subsequently covered by the second hard mask. A first reactive ion etch removes the remaining portion of the first protective layer not covered by the first hard mask 202. The second hard mask 204 of the second process covers a portion of a second protective layer (not shown) including the p-FET S/D region 208 and the overlap region, upon which the first protective layer has been deposited. A second reactive ion etch removes the remaining portion of the second protective layer not covered by the second hard mask 204. When the second hard mask 204 is removed, the second protective layer is disposed on that portion of the layer, which was covered by the second hard mask, and over the first protective layer, which had been deposited on the overlap region. That is, the overlap region is covered by both the first and second protective layers.

Referring to FIG. 2B, a first protective layer 212 is disposed over the gate, i.e., the left-end of the gate wire 105 of the n-FET 106 region, and the overlap region that had been masked by the first hard mask 102, while a second protective layer 214 is disposed over the gate, i.e., the right-end of the gate wire 105 of the p-FET S/D region 108, and the overlap region that had been masked by the second hard mask 104. Hence, the gate wire 105 is covered by two overlapping first and second protective layers in the overlap region. The increased thickness of the two overlapping protective layers, relative to the thickness of the one protective layer over each of the n-FET and p-FET gates, becomes problematic when the gate wire 105 is to be subsequently silicided both at the overlap region, which is a common junction for the gate inputs of a CMOS inverter, and over the individual n-FET and p-FET gates of the CMOS circuit. In a robust process to remove the relatively thicker overlapping first and second protective layers from the gate wire 105 in the overlap region, the relatively thinner protective layer over each of the n-FET and p-FET gates is subject to silicide-gate electrical shorts, caused by removing sidewalls of the n-FET and p-FET gate stacks.

There remains a need for an efficient and economical method of manufacturing a CMOS circuit of small dimensions in a gate first flow that prevents the problems, described above, in a method including epitaxial growth of strain-inducing materials in S/D regions of an n-FET and p-FET connected by a gate wire.

SUMMARY

In view of the foregoing, an exemplary embodiment of the invention disclosed herein comprises a method of manufacturing complementary transistor devices that patterns first gate stacks on a substrate and second gate stacks on the substrate. The first gate stacks and the second gate stacks each comprise a gate insulator on the substrate, a gate conductor on the gate insulator, and a first conformal insulator covering the gate insulator and the gate conductor. The method etches the substrate in regions between the first gate stacks and the second gate stacks to form recesses in the substrate and to reduce the thickness of the first conformal insulator. Then, the method grows first doped silicon regions in the recesses and deposits a second conformal insulator, different than the first conformal insulator, over the first doped silicon regions and over the first conformal insulator. Next, the method patterns a protective material to mask the first gate stacks and a portion of the second conformal insulator adjacent to the first gate stacks and removes the second conformal insulator from unmasked regions not protected by the protective material to leave exposed ones of the first doped silicon regions and to leave the first conformal insulator over all the first gate stacks and the second gate stacks. The method removes the exposed ones of the first doped silicon regions from the recesses to leave exposed recesses, and grows second doped silicon regions in the exposed recesses. The second doped silicon regions produce a second strain characteristic within the substrate that is different than the first strain characteristic produced by the first doped silicon regions.

In yet another embodiment of the invention, disclosed herein is a method of manufacturing a complementary metal oxide semiconductor (CMOS) circuit that etches, by a reactive ion etch (RIE), a CMOS circuit substrate to form recesses in a semiconductor substrate. The CMOS circuit substrate includes an n-type field effect transistor (n-FET) region including an n-FET gate stack including a gate, an insulating cap, and sidewalls formed on the semiconductor substrate, and source/drain (S/D) regions formed beneath and adjacent to the sidewalls within the semiconductor substrate. The CMOS circuit substrate also includes a p-type field effect transistor (p-FET) region including a p-FET gate stack including a gate, an insulating cap, and sidewalls formed on the semiconductor substrate, and S/D regions formed beneath and adjacent to the sidewalls within the semiconductor substrate. An isolation region is disposed between the n-FET region and the p-FET region and is formed within the semiconductor substrate. Further, a gate wire including the n-FET gate, the p-FET gate, and gate material extends transversely above the semiconductor substrate from the n-FET gate across the isolation region to the p-FET gate. The insulating cap and the sidewalls of the n-FET and the p-FET gate stacks are reduced in thickness by the RIE, and the recesses are formed adjacent to the sidewalls of reduced thickness of the n-FET and p-FET gate stacks within the S/D regions. The method further epitaxially grows silicon germanium (SiGe) in the recesses and deposits a thin insulator layer on the CMOS circuit substrate. Additionally, this method masks the p-FET region and a portion of the isolation region adjacent to the p-FET region and removes the thin insulator layer from an unmasked n-FET region and an unmasked portion of the isolation region adjacent to the n-FET region. Also, the method etches the CMOS circuit substrate with hydrogen chloride (HCl) to remove the SiGe from the recesses of the n-FET region, and epitaxially grows silicon carbon (SiC) in the recesses of the n-FET region.

One structure embodiment comprises a transistor structure that includes a substrate, at least one first transistor positioned on a first region of the substrate, and at least one second transistor positioned on a second region of the substrate. A gate conductor is also included. First portions of the gate conductor are positioned within the first transistor and second portions of the gate conductor are positioned within the second transistor. A first conformal insulator is positioned over the first portions of the gate conductor and the second portions of the gate conductor, and a second conformal insulator is positioned only over the second portions of the gate conductor.

Another structure embodiment herein comprises a transistor structure that includes a substrate, at least one first transistor positioned on a first region of the substrate, and at least one second transistor positioned on a second region of the substrate. A gate conductor is also included. First portions of the gate conductor are positioned within the first transistor and second portions of the gate conductor are positioned within the second transistor. A first conformal insulator is positioned over the first portions of the gate conductor and the second portions of the gate conductor, and a second conformal insulator is positioned only over the second portions of the gate conductor. Further, first strain producing regions are positioned within the substrate adjacent the channel regions of the first transistor, and second strain producing regions are positioned within the substrate adjacent the channel regions of the second transistor. The second strain producing regions cause a different type of strain within the channel regions relative to the first strain producing regions.

BRIEF DESCRIPTION OF THE DRAWINGS

The exemplary embodiments of the invention will be better understood from the following detailed description with reference to the drawings, which are not necessarily drawing to scale and in which:

FIGS. 8A-C illustrate, respectively, a cross-section of an n-FET region in FIG. 8A, a transverse section of an isolation region in FIG. 8B, and a cross section of a p-FET region in FIG. 8C of features of the CMOS circuit substrate of FIGS. 7A-C that may be subjected to masking of the p-FET region and a portion of the isolation region adjacent to the p-FET region with a photoresist mask in an exemplary embodiment of the invention;

FIGS. 9A-C illustrate, respectively, a cross-section of an n-FET region in FIG. 9A, a transverse section of an isolation region in FIG. 9B, and a cross section of a p-FET region in FIG. 9C of features of the CMOS circuit substrate of FIGS. 8A-C, following removal of portions of a protective layer that are not masked in an exemplary embodiment of the invention;

FIGS. 10A-C illustrate, respectively, a cross-section of an n-FET region in FIG. 10A, a transverse section of an isolation region in FIG. 10B, and a cross section of a p-FET region in FIG. 10C of features of the CMOS circuit substrate of FIGS. 9A-C that may be subjected to a hydrogen chloride (HCl) etching in an exemplary embodiment of the invention;

FIGS. 11A-C illustrate, respectively, a cross-section of an n-FET region in FIG. 11A, a transverse section of an isolation region in FIG. 11B, and a cross section of a p-FET region in FIG. 11C of features of the CMOS circuit substrate of FIGS. 10A-C that may be subjected to an epitaxial growth of silicon carbon (SiC) in an exemplary embodiment of the invention;

FIGS. 12A-C illustrate, respectively, a cross-section of an n-FET region in FIG. 12A, a transverse section of an isolation region in FIG. 12B, and a cross section of a p-FET region in FIG. 12C of features of the CMOS circuit substrate of FIGS. 11A-C that may be subjected to removal of the photoresist mask 1125 of FIGS. 11B and 11C in an exemplary embodiment of the invention.

DETAILED DESCRIPTION

Figure 1A:
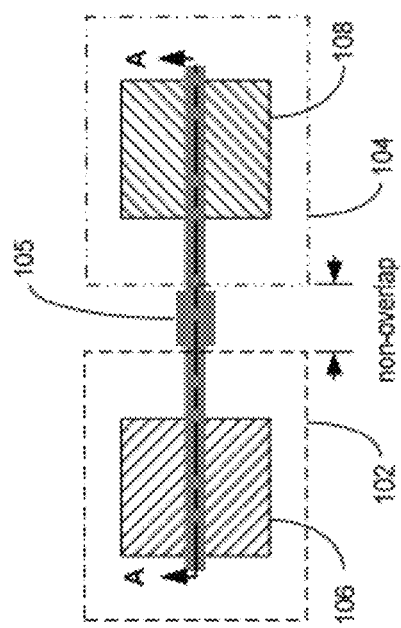
FIGS. 1A and 1B illustrate, respectively, a top view of a misalignment of two non-overlapping hard masks on formation of a CMOS circuit, and a transverse section of a portion of a gate wire of the CMOS circuit of FIG. 1A through a transverse section line A-A in related art.
Figure 1B:
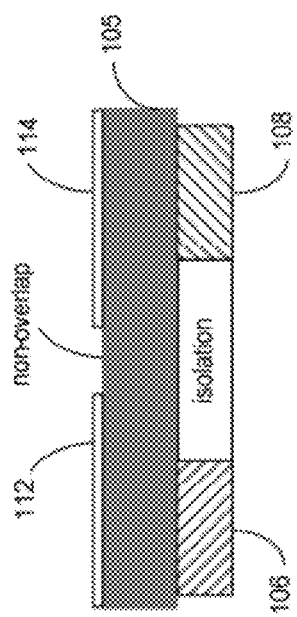
Figure 2A:
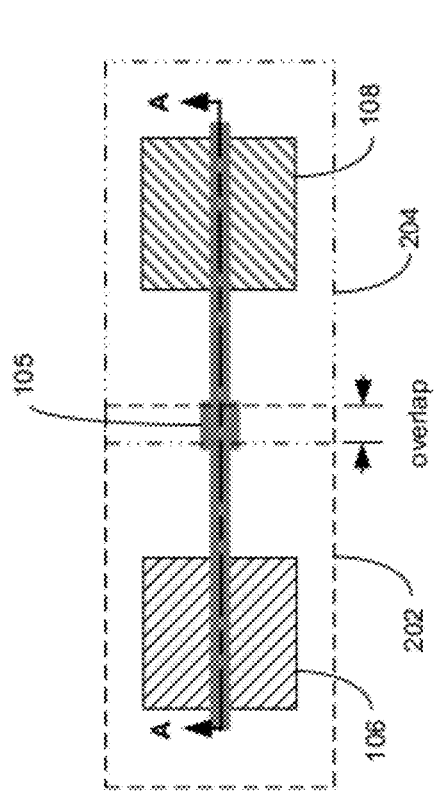
FIGS. 2A and 2B illustrate, respectively, a top view of a misalignment of two overlapping hard masks on formation of a CMOS circuit, and a transverse section of a portion of a gate wire of the CMOS circuit of FIG. 2A through a transverse section line A-A in related art.
Figure 2B:
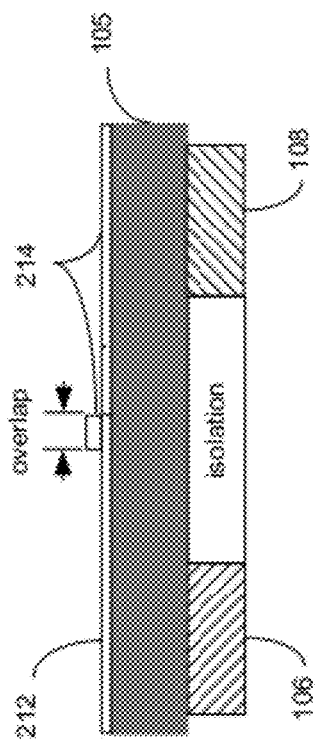

The exemplary embodiments of the invention and the various features and advantageous details thereof are explained more fully with reference to the non-limiting exemplary embodiments that are illustrated in the accompanying drawings and detailed in the following description. It should be noted that the features illustrated in the drawings are not necessarily drawn to scale. Descriptions of well-known materials, components, and processing techniques are omitted so as to not unnecessarily obscure the exemplary embodiments of the invention. The examples used herein are intended to merely facilitate an understanding of ways in which the exemplary embodiments of the invention may be practiced and to further enable those of skill in the art to practice the exemplary embodiments of the invention. Accordingly, the examples should not be construed as limiting the scope of the exemplary embodiments of the invention.

As described above, there remains a need for an efficient and economical method of manufacturing a CMOS circuit of small dimensions in a gate first flow that may prevent the problems associated with the non-overlap or overlap of successively deposited hard masks in a method of manufacturing a CMOS circuit a gate wire connects the gates of an n-FET and a p-FET.

Experimentation with the manufacture of 22 nanometer technology CMOS circuits using the two processes described above, revealed that a hydrogen chloride (HCl) in situ etch back of epitaxially grown silicon carbon (SiC) in the source/drain (S/D) regions of the n-FET would cause a defect in manufacture, when any HCl touched the previously epitaxially grown silicon germanium (SiGe) in the S/D regions of the p-FET. The defect comprised an extremely high rate of etching of the epitaxially grown SiGe by the HCl, such that the SiGe could be etched from the recesses proximate to the active channel of the p-FET. This observation suggested to the inventors an exemplary embodiment of the invention that provided a method using a single reactive ion etch (RIE) to form recesses within the S/D regions of the transistors of the CMOS circuit for successive epitaxial growths of the two embedded strain-inducing materials.

Figure 3:
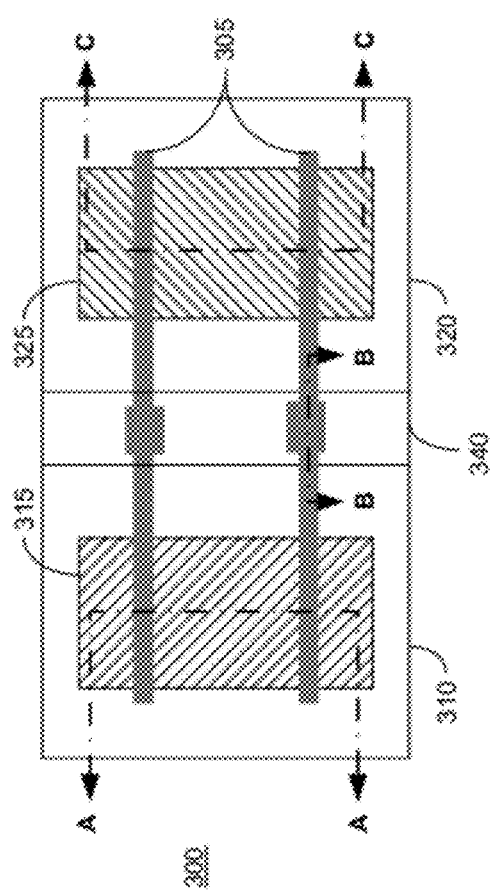
FIG. 3 illustrates a top view of structural features of a CMOS circuit substrate 300 in an exemplary embodiment of the invention.

Referring to FIG. 3, a top view illustrates some of the structural features of a CMOS circuit substrate 300 in an exemplary embodiment of the invention, and also provides a structural orientation to cross-sections and transverse sections of the following figures, which provide a sequential depiction of an exemplary embodiment of the invention. The CMOS circuit substrate 300 may comprise: an n-FET region 310, including n-FET S/D regions 315 formed within a semiconductor substrate; a p-FET region 320, including p-FET S/D regions 325 formed within the semiconductor substrate; an isolation region 340 formed within the semiconductor substrate and interposed between the n-FET region 310 and the p-FET region 320; and one or more gate wires 305 that extend transversely from the n-FET S/D regions 315 to the p-FET S/D regions 325 across the underlying semiconductor substrate.

Figure 4A:
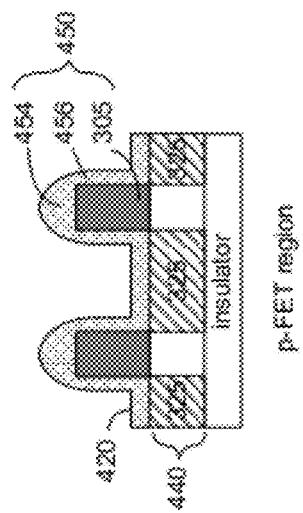
FIGS. 4A-C illustrate, respectively, a cross-section of an n-FET region in FIG. 4A, a transverse section of an isolation region in FIG. 4B, and a cross section of a p-FET region in FIG. 4C of features of the CMOS circuit substrate 300 of FIG. 3 in an exemplary embodiment of the invention.
Figure 4B:
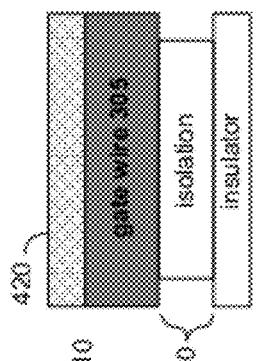
Figure 4C:
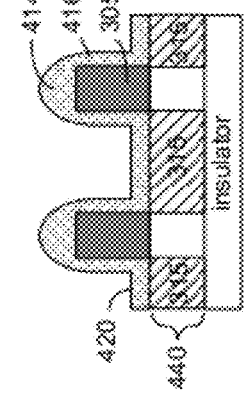

FIGS. 4A and 4C illustrate in cross-section and FIG. 4B in transverse section, structural features of the CMOS circuit substrate 300 of FIG. 3 in an exemplary embodiment of the invention.

FIG. 4A corresponds to a cross-section through the n-FET embedded S/D regions 315 of the n-FET region 310 of FIG. 3 at cross-section line A-A. One or more n-FET gate stacks 410, each including a portion of the gate wire 305 forming an n-FET gate, an insulating cap 414, and sidewalls 416, may be formed on a semiconductor substrate 440. When at least two n-FET gate stacks 410 are formed in the n-FET region, the at least two n-FET gate stacks 410 may be formed by a double- or multiple-patterning lithography process used for the manufacture of semiconductor devices of a 32 nanometer node technology or smaller in various exemplary embodiments of the invention. The n-FET embedded S/D regions 315 of the n-FET region are formed beneath and adjacent to the sidewalls 416 of the one or more n-FET gate stacks 410 within the semiconductor substrate 440 and may also include extensions or halos (not shown), as is well known in the art. The semiconductor substrate 440, upon which the one or more n-FET gate stacks 410 is formed, may comprise a silicon layer and the silicon layer may, in turn, form the upper layer of a silicon-on-insulator substrate in an exemplary embodiment of the invention. The insulator, shown in FIGS. 4A-C through 12A-C, may comprise a silicon oxide insulating layer formed on a supporting substrate of the silicon-on-insulator substrate. The CMOS circuit substrate, including the n-FET embedded S/D regions 315 of the n-FET region, may initially be covered by a protective layer 420 comprising a nitride material. Portions of the protective layer 420 may include the insulating cap 414 and sidewalls 416 of the one or more n-FET gate stacks 410. Other portions of the protective layer 420 may also cover the n-FET embedded S/D regions 315.

Similarly, FIG. 4C corresponds to a cross-section through the p-FET S/D regions 325 of the p-FET region 320 of FIG. 3 at cross-section line C-C. One or more p-FET gate stacks 450, each including another portion of the gate wire 305 forming a p-FET gate, an insulating cap 454, and sidewalls 456, may be formed on the semiconductor substrate 440. When at least two p-FET gate stacks 450 are formed in the p-FET region, the at least two p-FET gate stacks 450 may also be formed by the double- or multiple-patterning lithography process used for the manufacture of semiconductor devices of a 32 nanometer node technology or smaller in various exemplary embodiments of the invention. The p-FET embedded S/D regions 325 of the p-FET region are formed beneath and adjacent to the sidewalls 456 of the one or more p-FET gate stacks 450 within the semiconductor substrate 440 and may also include extensions or halos (not shown), as is well known in the art. The semiconductor substrate 440, upon which the one or more p-FET gate stacks 450 is formed, may comprise a silicon layer and the silicon layer may, in turn, form the upper layer of a silicon-on-insulator substrate. The CMOS circuit substrate, including the p-FET embedded S/D regions 325 of the p-FET region, may also be initially covered by the protective layer 420. Portions of the protective layer 420 may include the insulating cap 454 and sidewalls 456 of the one or more p-FET gate stacks 450. Other portions of the protective layer 420 may also cover the p-FET embedded S/D regions 325.

FIG. 4B corresponds to a transverse-section of a portion of one of the gate wires 305 through isolation region and portions of the n-FET and p-FET regions at transverse-section line C-C of FIG. 3. Thus, the transverse-section of FIG. 4B is orthogonal to the cross sections of FIGS. 4A and 4C, and in particular, may illustrate the processes of an exemplary embodiment of the invention on yet another portion of the gate wire 305, which is disposed within the isolation region and connected to the portion of the gate wire 305 forming an n-FET gate shown in cross-section by FIG. 4A and the another portion of the gate wire 305 forming a p-FET gate shown in cross-section by FIG. 4C. In the two separate conventional processes described above, the portion of the gate wire disposed within the isolation region was either exposed in a non-overlap region, which was subsequently subject to unwanted epitaxial growth, or covered by two overlapping protective layers, which was subsequently subject to unwanted silicide-gate electrical shorts caused by removing sidewalls of the n-FET and p-FET gate stacks.

Referring to FIG. 4B, a portion of the gate wire 305 transversely extends across the isolation region disposed between the n-FET region of FIG. 4A and the p-FET region of FIG. 4C in an exemplary embodiment of the invention. The height of the portion of the gate wire 305 illustrated in FIG. 4B may be substantially the same height as that of the portion of the gate wire 305 forming the n-FET gate shown in FIG. 4A and that of the another portion of the gate wire 305 forming the p-FET gate shown in FIG. 4C. The gate wire 305, which includes the gates of the n-FET and p-FET regions, may comprise polysilicon in various exemplary embodiments of the invention. The height of the protective layer 420 that covers the gate wire 305 in the isolation region may be substantially the same as the heights of the insulating caps 414, 452 of the n-FET and p-FET regions shown in FIGS. 4A and 4C, respectively.

Figure 5A:
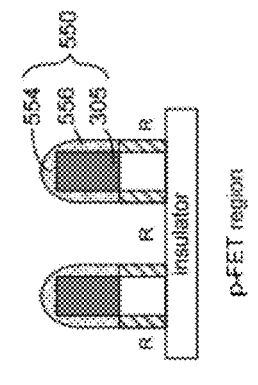
FIGS. 5A-C illustrate, respectively, a cross-section of an n-FET region in FIG. 5A, a transverse section of an isolation region in FIG. 5B, and a cross section of a p-FET region in FIG. 5C of features of the CMOS circuit substrate of FIGS. 4A-C that may be subjected to a reactive ion etch (RIE) to form recesses (R) in a semiconductor substrate of an exemplary embodiment of the invention.
Figure 5B:
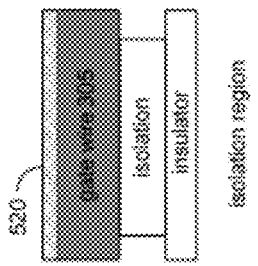
Figure 5C:
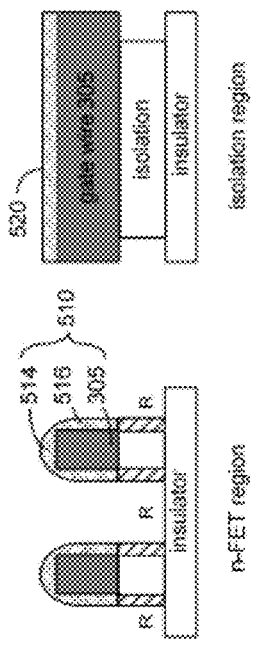

FIGS. 5A and 5C illustrate in cross-section and FIG. 5B in transverse section, structural features of the CMOS circuit substrate of FIGS. 4A-C that may be subjected to a reactive ion etch (RIE) to form recesses (R) in the semiconductor substrate 440 of an exemplary embodiment of the invention.

FIGS. 5A and 5C correspond to cross-sections through the n-FET S/D regions 315 of the n-FET region 310 and the p-FET S/D regions 325 of the p-FET region 320 at cross-section lines A-A and C-C, respectively, of FIG. 3. Subjecting the CMOS circuit substrate of FIGS. 4A-C to RIE may cause the insulating caps 514, 554 and the sidewalls 516, 556 of the one or more gate stacks 510, 550 of the n-FET and p-FET regions in FIGS. 5A and 5C, respectively, to be become reduced in thickness from about 6 nm to about 9 nm, relative to the thicknesses of the insulating caps 414, 454 and the sidewalls 416, 456 of the one or more gate stacks 410, 450 prior to the RIE, as shown in FIGS. 4A and 4C, respectively. The RIE may also remove portions of the protective layer 420 disposed over the embedded S/D regions 315, 325 of the n-FET and p-FET regions, shown in FIGS. 4A and 4C, to form recesses (R) that extend down to an insulator as shown in FIGS. 5A and 5C. After formation of the recesses (R), those portions of the embedded S/D regions (cross-hatched) in FIGS. 5A and 5C protected from the RIE by the overlying sidewalls of reduced thickness 516, 556 of the one or more gate stacks 510, 556 of the n-FET and p-FET regions, respectively, may comprise portions of the CMOS circuit of an exemplary embodiment of the invention.

Referring to FIG. 5B, the height of the protective layer 520 that covers the gate wire 305 in the isolation region may also be reduced in thickness from about 6 nm to about 9 nm by the RIE of the CMOS circuit substrate of FIGS. 4A-C. The height of the protective layer 520 that covers the gate wire 305 in the isolation region may be substantially the same as the heights of the insulating caps 514, 552 in FIGS. 5A and 5C, respectively. It may be noted that following the RIE, the gate wire 305 disposed between the n-FET region and the p-FET region in the isolation region is not exposed and is protected by the overlying protective layer 520.

Figure 6A:
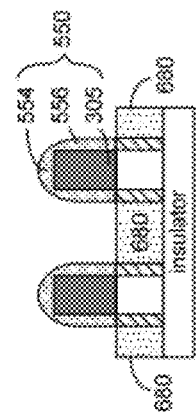
FIGS. 6A-C illustrate, respectively, a cross-section of an n-FET region in FIG. 6A, a transverse section of an isolation region in FIG. 6B, and a cross section of a p-FET region in FIG. 6C of features of the CMOS circuit substrate of FIGS. 5A-C that may be subjected to a total silicon germanium (SiGe) fill in an exemplary embodiment of the invention.
Figure 6B:
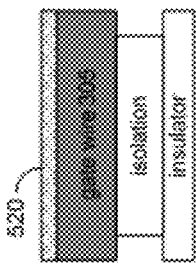
Figure 6C:
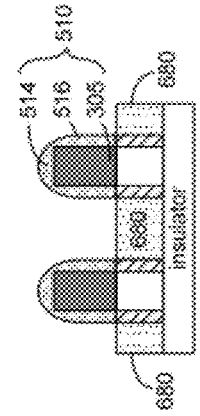

FIGS. 6A and 6C illustrate in cross-section and FIG. 6B in transverse section, structural features of the CMOS circuit substrate of FIGS. 5A-C that may be subjected to a total silicon germanium (SiGe) fill in an exemplary embodiment of the invention.

FIGS. 6A and 6C correspond to cross-sections through the n-FET S/D regions 315 of the n-FET region 310 and the p-FET S/D regions 325 of the p-FET region 320 at cross-section lines A-A and C-C, respectively, of FIG. 3. Subjecting the CMOS substrate of FIGS. 5A-C to a total SiGe fill, by an epitaxial growth of SiGe, may form embedded SiGe strain-inducing regions 680 upon the exposed insulator in the recesses (R) of FIGS. 5A and 5C, in the n-FET and p-FET regions shown in FIGS. 6A and 6C.

Referring to 6B, there may be substantially no change to the protective layer 520, because SiGe cannot grow on the protective layer 520.

Figure 7A:
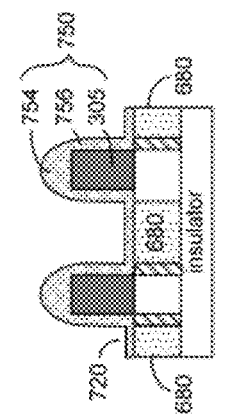
FIGS. 7A-C illustrate, respectively, a cross-section of an n-FET region in FIG. 7A, a transverse section of an isolation region in FIG. 7B, and a cross section of a p-FET region in FIG. 7C of features of the CMOS circuit substrate of FIGS. 6A-C that may be subjected to a deposition of a thin insulator layer in an exemplary embodiment of the invention.
Figure 7B:
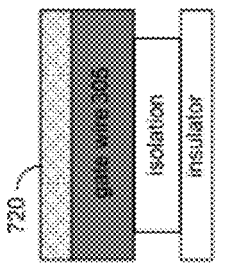
Figure 7C:
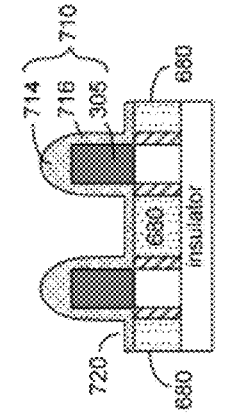

FIGS. 7A and 7C illustrate in cross-section and FIG. 7B in transverse section, structural features of the CMOS circuit substrate of FIG. 6A-C that may be subjected to a deposition of a thin insulator layer in an exemplary embodiment of the invention. The composition of the thin insulator layer may be a nitride that is the same or different from the composition of the insulating caps 514, 554 and sidewalls 516, 556 of the n-FET and p-FET gate stacks 510, 550 of FIGS. 6A and 6C, respectively, and of the protective layer 520 covering the gate wire in the isolation region of FIG. 6B.

FIGS. 7A and 7C correspond to cross-sections through the n-FET S/D regions 315 of the n-FET region 310 and the p-FET S/D regions 325 of the p-FET region 320 at cross-section lines A-A and C-C, respectively, of FIG. 3. Subjecting the CMOS circuit substrate of FIGS. 6A-C to, for example, a molecular layer deposition of a thin insulator layer may cause portions of the protective layer 720, comprising the insulating caps 714, 754 of the one or more gate stacks 710, 760 of the n-FET and p-FET regions in FIGS. 7A and 7C, respectively, to be become thicker by about 3 nm to about 6 nm, relative to the thicknesses of the insulating caps 514, 554 of the one or more gate stacks 510, 550 in FIGS. 6A and 6C, respectively.

As also shown in FIGS. 7A and 7C, the deposition of the thin insulator layer may also form other portions of the protective layer 720 that overlie the embedded SiGe strain-inducing regions 680 of the n-FET and p-FET regions shown in FIGS. 6A and 6C, respectively.

Referring to FIG. 7B, the height of the protective layer 720 that covers the gate wire in the isolation region may be thicker by about 3 nm to about 6 nm than that of the protective layer 620 of FIG. 6B, with a thickness approximately equal to a thickness of the deposition of the thin insulator layer.

FIGS. 8A and 8C illustrate in cross-section and FIG. 8B in transverse section, structural features of the CMOS circuit substrate of FIGS. 7A-C that may be subjected to masking of the p-FET region and a portion of the isolation region adjacent to the p-FET region with a photoresist mask in an exemplary embodiment of the invention.

FIGS. 8A and C correspond to cross-sections through the n-FET S/D regions 315 of the n-FET region 310 and the p-FET S/D regions 325 of the p-FET region 320 at cross-section lines A-A and C-C, respectively, of FIG. 3. Referring to FIGS. 8A and 8C, respectively, the n-FET region of the CMOS substrate is not masked, while the p-FET region of the CMOS circuit substrate may be masked with a photoresist mask 825.

Referring to FIG. 8B, a portion of the protective layer 720 that is adjacent to the p-FET region may also be masked with the photoresist mask 825. In masking regions of a CMOS circuit substrate of a 32 nanometer node technology or smaller, misalignment of a mask with underlying edges of an active circuit region is likely. Therefore, the area of photoresist mask 825 mask may be larger than that of the p-FET region to avoid leaving a portion of the p-FET region unmasked. Hence, the photoresist mask 825 may overlie a portion of the adjacent isolation region. In FIG. 8B, the height of the protective layer 720 in both masked and unmasked portions of the CMOS circuit substrate may be substantially the same.

FIGS. 9A and 9C illustrate in cross-section and FIG. 9B in transverse section, structural features of the CMOS circuit substrate of FIGS. 8A-C, following removal of portions of the protective layer 720 that are not masked in an exemplary embodiment of the invention.

FIGS. 9A and 9C correspond to cross-sections through the n-FET S/D regions 315 and n-FET region 310 and the p-FET S/D regions 325 and p-FET region 320 at cross-section lines A-A and C-C, respectively, of FIG. 3. Removing portions of the unmasked protective layer 720 from above the embedded SiGe regions 680 of the n-FET region shown in FIG. 8A, may be accomplished by, for example, an etching process, such as a reactive ion etch (RIE). The removal of portions of the unmasked protective layer 720, shown in FIG. 8A, may expose embedded SiGe regions 680 that are devoid of a protective layer as shown in FIG. 9A. In addition, as shown in FIG. 9A, removing unmasked portions of the protective layer 720 may also cause the insulating cap 914 of the one of more gate stacks 910 of the n-FET region to become reduced in thickness by about 3 nm to about 9 nm when compared to the insulating cap 714 of the one or more gate stacks 710 of the n-FET region shown in FIG. 8A. In FIG. 9C, however, the p-FET region are masked by photoresist mask 825. The structures underlying the photoresist mask 825 in the p-FET region of FIG. 9C may be unaffected by removing portions of the unmasked protective layer. In particular, the height of the insulating cap 754 of the one or more gate stacks 750 of the p-FET region may be substantially the same as that of the insulating cap 854 of the one or more gate stacks 850 shown in FIG. 8C. Therefore, following removal of portions of the protective layer 720 that are not masked in FIGS. 8A and 8C, the height of the insulating cap 914 covering the one or more gate stacks 910 of the n-FET region of FIG. 9A may be reduced in height by about 3 nm to about 9 nm relative to the height of the insulating cap 754 covering the one or more gate stacks 750 of the p-FET region shown in FIG. 9C.

Referring to FIG. 9B, the removal of the thin insulator layer above the n-FET region may also reduce in thickness by about 3 nm to about 6 nm, a portion of the protective layer 920, which is not masked by the photoresist mask 825, while that portion of the protective layer 920, which is protected by the photoresist mask 825, remains at a height substantially equal to that of the protective layer 720 shown in FIG. 8B. In the isolation region, the portion of the protective layer 920 that is reduced in thickness relative to that portion of the protective layer, which is masked, may be reduced in thickness by about 3 nm to about 6 nm, an amount approximately equal to the thickness of the deposition of the insulator layer.

FIGS. 10A and 10C illustrate in cross-section and FIG. 10B in transverse section, structural features of the CMOS circuit substrate of FIGS. 9A-C that may be subjected to a hydrogen chloride (HCl) etching in an exemplary embodiment of the invention.

FIGS. 10A and 10C correspond to cross-sections through the n-FET S/D regions 315 and n-FET region 310 and the p-FET S/D regions 325 and p-FET region 320 at cross-section lines A-A and C-C, respectively, of FIG. 3. Subjecting the CMOS circuit substrate of FIGS. 9A-C to an HCl etching may cause the exposed embedded SiGe regions 680 of the n-FET region of FIG. 9A to be etched out at an extremely high rate down to the insulator to form recesses (R) in the n-FET region as shown in FIG. 10A. The HCl etching may have little effect upon the thicknesses of the protective layer that comprises the insulating cap 914 and the sidewalls 916 of the one or more gate stacks 910 of the n-FET region in FIG. 10A, when compared to the thicknesses of the insulating cap 914 and the sidewalls 916 of the one or more of the gate stacks 910 of FIG. 9A. As the p-FET region is masked by the photoresist mask 825, the structures of the p-FET region underlying the photoresist mask 825 may remain substantially unaffected by the HCL etching, as shown in FIG. 10C, when compared to the structures of the p-FET region in FIG. 9C.

Referring to FIG. 10B, the portion of the protective layer 920, which is not masked by the photoresist mask 825 in the isolation region, may be substantially unaffected by the HCl etching and may remain substantially equal in height to that portion of the protective layer 920, which is not masked by the photoresist mask 825 in FIG. 9B. Likewise, the portion of the protective layer 920, which is masked by the photoresist mask 825 in the isolation region, may also be substantially unaffected by the HCl etching and may remain substantially equal in height to that portion of the protective layer 920, which is masked by the photoresist mask 825 in FIG. 9B.

FIGS. 11A and 11C illustrate in cross-section and FIG. 11B in transverse section, structural features of the CMOS circuit substrate of FIGS. 10A-C that may be subjected to an epitaxial growth of silicon carbon (SiC) in an exemplary embodiment of the invention.

FIGS. 11A and 11C correspond to cross-sections through the n-FET S/D regions 315 and n-FET region 310 and the p-FET S/D regions 325 and p-FET region 320 at cross-section lines A-A and C-C, respectively, of FIG. 3. Subjecting the CMOS substrate of FIGS. 10-10C to epitaxial growth of SiC may allow embedded SiC strain-inducing regions 1190, shown in FIG. 11A, to form on the insulator in the recesses (R) of the n-FET region shown in FIG. 10A. In contrast, the p-FET region of FIG. 11C remains masked by the photoresist mask 825 and no epitaxial growth of SiC may occur. Hence, the structures of the p-FET region underlying the photoresist mask 825 may remain substantially unaffected when compared to the structures of the p-FET region in FIG. 10C.

Referring to FIG. 11B, there may be substantially no change to either the masked or unmasked portions of the protective layer 920, when compared to either the masked or unmasked portions of the protective layer 920 of FIG. 10B, because SiC cannot grow on either the protective layer 920 or the photoresist mask 825.

FIGS. 12A and 12C illustrate in cross-section and FIG. 12B in transverse section, structural features of the CMOS circuit substrate of FIGS. 11A-C that may be subjected to removal of the photoresist mask 825 of FIGS. 11B and 11C in an exemplary embodiment of the invention.

FIGS. 12A and 12C correspond to cross-sections through the n-FET S/D regions 315 and n-FET region 310 and the p-FET S/D regions 325 and p-FET region 320 at cross-section lines A-A and C-C, respectively, of FIG. 3. Removing the photoresist mask 825 from the p-FET region of FIG. 11C may yield the structures of the p-FET region shown in FIG. 12C. As no photoresist mask was formed on the n-FET region, the n-FET region of FIG. 12A may be substantially the same as that in FIG. 11A.

The n-FET region of FIG. 12A may differ from that of the p-FET region of FIG. 12C, in that, (1) the embedded S/D regions of the n-FET region of FIG. 12A may contain embedded SiC regions 1190, while the corresponding embedded S/D regions of the p-FET region of FIG. 12C may contain embedded SiGe regions 680, and (2) the height of the insulating cap 914 of the one or more gate stacks 910 of the n-FET region shown in FIG. 12A is less than that of the height by about 3 nm to about 6 nm of the insulating cap 754 of the one or more gate stacks 750 of the p-FET shown in FIG. 12C, by an amount approximately equal to a thickness of the deposition of the thin insulator layer.

Referring to FIG. 12B, a portion of the protective layer 920 adjacent to the n-FET region may be reduced in thickness relative to another portion of the protective layer 920 adjacent to the p-FET region by about 3 nm to about 6 nm, an amount approximately equal to that of the deposition of the thin insulator layer.

When compared to the conventional two processes for introducing strain-inducing materials into the S/D regions proximate to the channels of n-FET and p-FET transistors in a gate first flow for the manufacture of a CMOS circuit, including a gate wire extending from the gate of an n-FET transistor across an isolation region to the gate of a p-FET transistor, the method of an exemplary embodiment of the invention, detailed above, does not have the problems of either exposing a portion of the gate wire in the isolation region to epitaxial growth of a strain-inducing material, which may cause defects in a subsequent silicidation process, or causing silicide-gate electrical shorts by removing sidewalls of the n-FET and p-FET gate stacks, when also removing the two overlapping protective layers from a portion of the gate wire in an isolation region. The absence of these problems is explained by the fact that the gate wire of the isolation region, in an exemplary embodiment of the invention, is always protected by an overlying protective layer, and that the height of the insulating cap of the one or more gate stacks of the n-FET region and the height of a portion of the protective layer, adjacent to the n-FET region, in the isolation region differs from the height of the insulating cap of the one or more gate stacks of the p-FET region and the height of a remaining portion of the protective layer, adjacent to the n-PET region, in the isolation region by an amount approximately equal to that of the deposition of the thin insulator layer.

Thus, as shown in FIGS. 12A-12C, the methods herein produce a transistor structure that includes a substrate, shown in FIGS. 4A-C, at least one first transistor positioned on a first region of the substrate as shown in FIG. 4A, and at least one second transistor positioned on a second region of the substrate. A gate conductor 305 is also included. First portions of the gate conductor 305 are positioned within the first transistor as shown in FIG. 4A and second portions of the gate conductor are positioned within the second transistor as shown in FIG. 4C. The first transistor comprises an n-type transistor and the second transistor comprises a p-type transistor.

In addition, when compared to the two conventional processes for introducing two different strain-inducing materials, the present invention provides a comparative enhancement of charge carrier mobilities. This is because in each of the two conventional processes, an insulating layer is deposited before each subsequent reactive ion etch to create recesses for the strain-inducing materials and this insulating layer increases distance from the embedded S/D regions to the gate, thereby decreasing charge carrier mobility. In the present invention, however, such an insulating layer is not used and the embedded S/D regions are in proximity to the gate, thereby increasing charge carrier mobility.

A first conformal insulator 420 is positioned over the first portions of the gate conductor 305 and the second portions of the gate conductor 305, and a second conformal insulator 720 is positioned over the second portions of the gate conductor (the second conformal insulator layer contacts the first conformal insulator layer and is thinner than the first conformal insulator layer). The second conformal insulator layer comprises a deposition layer. For example, the second conformal insulator layer can have a thickness from about 3 nm to about 6 nm.

Further, first strain producing regions 1190 are positioned within the substrate adjacent the channel regions of the first transistor, and second strain producing regions 680 are positioned within the substrate adjacent the channel regions of the second transistor. The second strain producing regions 680 cause a different type of strain within the channel regions relative to the first strain producing regions 1190.

Figure 13:
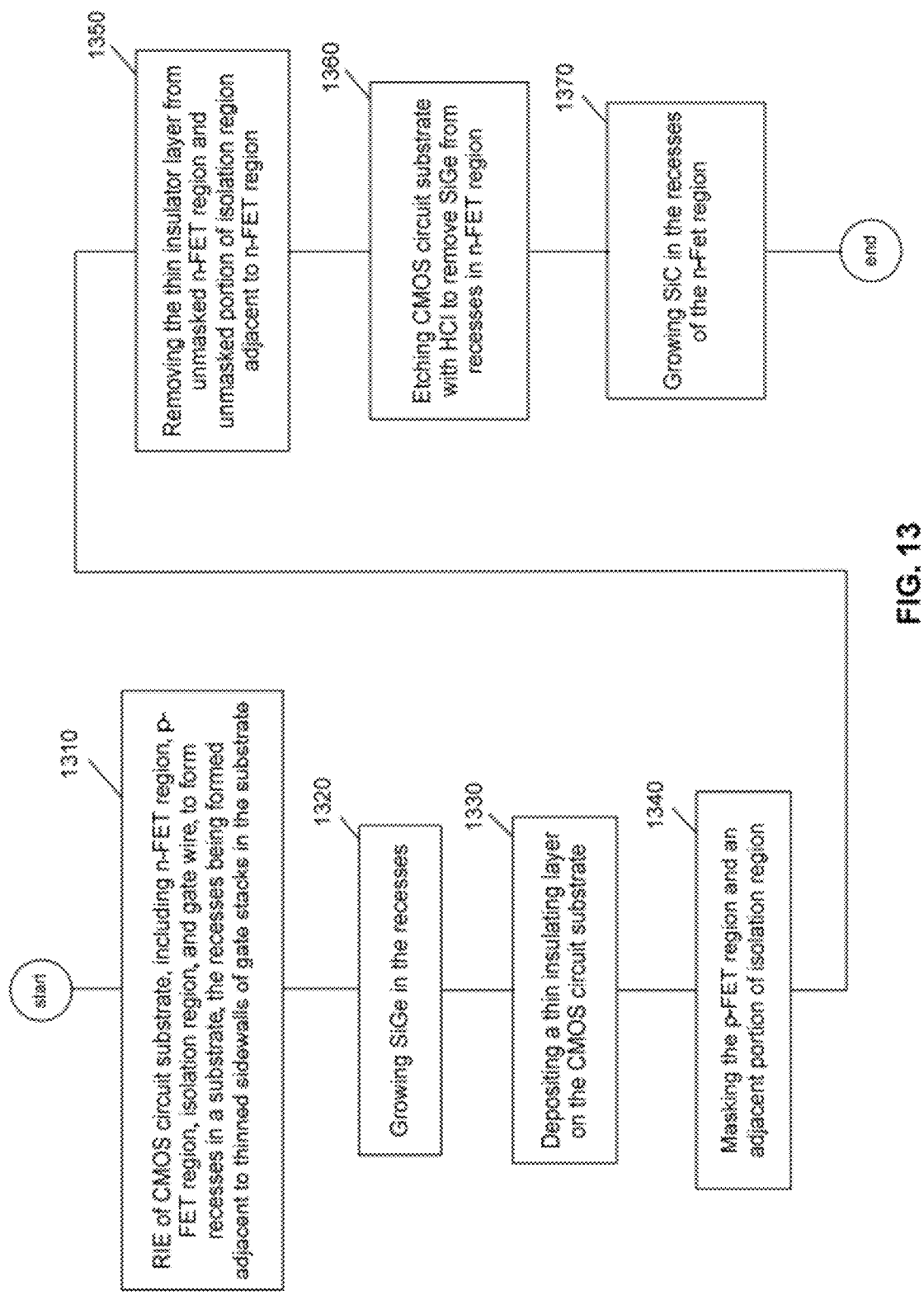
FIG. 13 illustrates a flow chart of a method of manufacturing a CMOS circuit in an exemplary embodiment of the invention.

FIG. 13 illustrates a flow chart of a method of manufacturing a CMOS circuit by an exemplary embodiment of the invention. The method may initially start by a reactive ion etch (RIE) of a CMOS circuit substrate that forms recesses in a semiconductor substrate, in which the CMOS circuit substrate comprises: an n-type field effect transistor (n-FET) region comprising an n-FET gate stack including a gate, an insulating cap, and sidewalls formed on the semiconductor substrate; a p-type field effect transistor (p-FET) region comprising a p-FET gate stack including a gate, an insulating cap, and sidewalls formed on the semiconductor substrate; an isolation region disposed between the n-FET and p-FET regions and formed within the semiconductor substrate; and a gate wire comprising the n-FET gate, the p-FET gate, and gate material extending transversely from the n-FET gate across the isolation region to the p-FET gate, wherein the RIE reduces in thickness the insulating cap and the sidewalls of the n-FET and the p-FET gate stacks, and wherein the recesses are formed adjacent to the sidewalls of reduced thickness within the semiconductor substrate 1310; growing silicon germanium (SiGe) in the recesses 1320; depositing a thin insulator layer on the CMOS circuit substrate 1330; masking the p-FET region and a portion of the isolation region adjacent to the p-FET region 1340; removing the thin insulator layer from an unmasked n-FET region and an unmasked portion of the isolation region adjacent to the n-FET region 1350; etching the CMOS circuit substrate with hydrogen chloride (HCl) to remove the SiGe from the recesses of the n-FET region 1360; and growing silicon carbon (SiC) in the recesses of the n-FET region 1370.

What is claimed is:

1. A method of manufacturing complementary transistor devices, said method comprising:
    patterning first gate stacks on a first region of a substrate and second gate stacks on a second region of said substrate, said first gate stacks and said second gate stacks each comprising a gate insulator on said substrate, a gate conductor on said gate insulator, and a first conformal insulator layer covering said gate insulator and said gate conductor;
    etching said substrate simultaneously in regions between said first gate stacks and said second gate stacks to form recesses in said substrate and to reduce a thickness of said first conformal insulator;
    growing first doped silicon in said recesses;
    depositing a second conformal insulator layer, different than said first conformal insulator layer, over said first doped silicon and over said first conformal insulator layer;
    patterning a protective material to mask a first portion of said second conformal insulator layer covering said first gate stacks and said first doped silicon adjacent to said first gate stacks;
    removing a second portion of said second conformal insulator layer from unmasked regions not protected by said protective material to fully expose top surfaces of said first doped silicon adjacent to said second gate stacks, said removing of said second portion being performed so as to leave intact said first conformal insulator over all said first gate stacks and said second gate stacks;
    removing, from said recesses adjacent to said second gate stacks, said first doped silicon that has said top surfaces fully exposed using a hydrogen chloride (HCL) etch process that is highly selective to said first doped silicon over said substrate and said first conformal insulator layer; and
    after said removing of said first doped silicon, growing second doped silicon-in said recesses adjacent to said second gate stacks, said second doped silicon producing a second strain characteristic within said substrate that is different than a first strain characteristic produced by said first doped silicon.

2. The method of claim 1, said first gate stacks comprising portions of p-type transistors and said second gate stacks comprising portions of n-type transistors.

3. The method of claim 1, said substrate comprising a silicon substrate, said first doped silicon comprising silicon germanium, and said second doped silicon comprising silicon carbon.

4. The method of claim 1, said depositing of said second conformal insulator layer comprising a molecular layer deposition process.

5. The method of claim 1, said second conformal insulator layer comprising about 3 nm to about 9 nm in thickness.

6. A method of manufacturing a complementary metal oxide semiconductor (CMOS) circuit, said method comprising:
    etching, by a reactive ion etch (RIE), a CMOS circuit substrate to form recesses in a semiconductor substrate, wherein said CMOS circuit substrate comprises:

an n-type field effect transistor (n-FET) region comprising an n-FET gate stack including a gate, an insulating cap, and sidewalls formed on said semiconductor substrate, and source/drain (S/D) regions formed beneath and adjacent to said sidewalls within said semiconductor substrate;

a p-type field effect transistor (p-FET) region comprising a p-FET gate stack including a gate, an insulating cap, and sidewalls formed on said semiconductor substrate, and S/D regions formed beneath and adjacent to said sidewalls within said semiconductor substrate;

an isolation region disposed between said n-FET region and said p-FET region and formed within said semiconductor substrate; and a gate wire comprising said n-FET gate, said p-FET gate, and gate material extending transversely above said semiconductor substrate from said n-FET gate across said isolation region to said p-FET gate, said insulating cap and said sidewalls of said n-FET and said p-FET gate stacks being reduced in thickness by said RIE, and said recesses being formed adjacent to said sidewalls of reduced thickness of said n-FET and p-FET gate stacks within said S/D regions;

epitaxially growing silicon germanium (SiGe) in said recesses;

depositing a thin insulator layer on said CMOS circuit substrate;

masking said p-FET region and a portion of said isolation region adjacent to said p-FET region;

removing said thin insulator layer from an unmasked n-FET region so as to fully expose a top surfaces of said SiGe in said recesses of said unmasked n-FET region and from an unmasked portion of said isolation region adjacent to said unmasked n-FET region;

etching said CMOS circuit substrate with hydrogen chloride (HCl) to remove said SiGe from said recesses of said unmasked n-FET region, said etching being selective to said SiGe over said semiconductor substrate and said insulating cap; and epitaxially growing silicon carbon (SiC) in said recesses of said n-FET region.

7. The method of claim 6, said CMOS circuit substrate covered by a protective layer, portions of said protective layer comprising said insulating cap and said sidewalls of said n-FET and p-FET gate stacks that cover said gates of said n-FET and p-FET gate stacks.

8. The method of claim 7, said gate wire comprising polysilicon;
said protective layer comprising a nitride layer; and
said thin insulator layer comprising another nitride layer.

9. The method of claim 6, said RIE reducing said insulating cap and said sidewalls of said n-FET and said p-FET gate stacks from about 3 nm to about 6 nm.

10. The method of claim 6, said thin insulator layer being from about 3 nm to about 6 nm in thickness.

11. A method of manufacturing complementary transistor devices, said method comprising:

providing a semiconductor layer comprising a first region, a second region positioned laterally adjacent to said first region and an isolation region that separates said first region from said second region;

forming a plurality of parallel gate wires on said semiconductor layer such that said parallel gate wires traverse said first region, said isolation region and said second region;

depositing a first conformal insulator layer such that insulating cap portions of said first conformal insulator layer on tops of said gate wires have a greater thickness than other portions of said first conformal insulator layer;

performing a first etch process that simultaneously etches first recesses through said first conformal insulator layer and extending into said first region and second recesses through said first conformal insulator layer and extending into said second region such that, in said first region, first channel regions below said parallel gate wires are positioned laterally between said first recesses and, in said second region, second channel regions below said parallel gate wires are position laterally between said second recesses, said first etch process reducing said thickness of said insulating cap portions of said first conformal insulator layer without exposing said tops and opposing sidewalls of said gate wires;

after said performing of said first etch process, simultaneously growing a first semiconductor in said first recesses and in said second recesses;

after said growing of said first semiconductor, depositing a second conformal insulator layer, different than said first conformal insulator layer;

patterning a protective material to form a mask that covers a first portion of said second conformal insulator layer, said first portion being above said first region and extending laterally onto said isolation region;

after said mask is formed, performing a second etch process to remove an exposed second portion of said second conformal insulator layer that is above said second region and that extends laterally onto said isolation region to said mask;

performing third etch process different from said first etch process and said second etch process to selectively remove said first semiconductor from said second recesses, said second etch process being selective to said first semiconductor over said semiconductor layer and said first conformal insulator layer; and after said performing of said third etch process, growing a second semiconductor in said second recesses, said second semiconductor being different from said first semiconductor.

12. The method of claim 11, said parallel gate wires comprising:
first gate stacks above said first region and comprising portions of p-type transistors; and
second gate stacks above said second region and comprising portions of n-type transistors.

13. The method of claim 11, said removing of said second portion of said second conformal insulator layer resulting in first sections of said gate wires, which are above said first region and extend laterally onto said isolation region, to have thicker insulating caps than second sections of said gate wires, which are above said second region and extending laterally onto said isolation region adjacent to said first sections.

14. The method of claim 11, said semiconductor layer comprising silicon, said first semiconductor comprising silicon germanium, said first conformal insulator layer comprising a silicon nitride and said second semiconductor comprising silicon carbon.

15. The method of claim 11, said third etch process comprising a hydrogen chloride etch process that is highly selective to silicon germanium over silicon and silicon nitride.

16. The method of claim 11, said first etch process and said second etch process each comprising a reactive ion etch process.

* * * * *